United States Patent
Simmons et al.

(10) Patent No.: US 7,558,995 B1
(45) Date of Patent: Jul. 7, 2009

(54) METHOD AND APPARATUS FOR ELIMINATING NOISE INDUCED ERRORS DURING TEST OF A PROGRAMMABLE LOGIC DEVICE

(75) Inventors: Randy J. Simmons, San Jose, CA (US); Teymour M. Mansour, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 593 days.

(21) Appl. No.: 11/285,569

(22) Filed: Nov. 21, 2005

(51) Int. Cl.
*G01R 31/28* (2006.01)
*G06K 5/04* (2006.01)
*G11B 5/00* (2006.01)

(52) U.S. Cl. ...................... 714/724; 714/700
(58) Field of Classification Search .............. None
See application file for complete search history.

(56) References Cited

U.S. PATENT DOCUMENTS

RE37,195 E * 5/2001 Kean ........................... 326/39
6,255,849 B1 * 7/2001 Mohan ......................... 326/41
6,810,514 B1 * 10/2004 Alfke et al. .................. 716/16

* cited by examiner

Primary Examiner—Christine T Tu
(74) *Attorney, Agent, or Firm*—Michael T. Wallace; Michael R. Hardaway

(57) ABSTRACT

A method and apparatus for substantially eliminating noise induced errors caused by a premature start-up sequence between configuration of an integrated circuit (IC) and execution of functional test vectors. A noise elimination sequence is executed, whereby the configuration bitstream associated with the IC is scanned for the existence of a start-up sequence. If found, the start-up sequence is stripped from the configuration bitstream and the IC is then configured using the modified configuration bitstream. The input/output (I/O) pins of the IC remain in a deactivated state until a startup sequence is transmitted to the IC via a Joint Test Action Group (JTAG) port of the IC, which then allows IC testing to commence.

5 Claims, 5 Drawing Sheets

METHOD AND APPARATUS FOR ELIMINATING NOISE INDUCED ERRORS DURING TEST OF A PROGRAMMABLE LOGIC DEVICE

FIELD OF THE INVENTION

The present invention generally relates to programmable logic devices (PLDs), and more particularly to the protection of the initialized condition of the PLD prior to testing of the PLD.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA, including the initial condition of the FPGA as defined by the individual memory cells.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Once the PLD is configured, it is often desirable to validate the configuration through the execution of functional vectors that are based upon the PLD configuration. In the automated test equipment (ATE) environment, however, there is a time period that exists between PLD configuration and the execution of functional vectors, where the PLD initialization may be disturbed by ATE noise, or some other noise source. If the initialized state of the configured PLD is disturbed, then the functional vectors, e.g., stimulus and response, for that particular configuration will not be correct.

Conventional techniques used to mitigate noise induced errors during execution of functional vectors include executing a reset of the PLD subsequent to configuration and prior to the execution of the functional vectors. However, if enough noise is present after reset, then the PLD may nevertheless be "clocked" by the noise to initiate write sequences into previously configured BRAM, to initiate read captures from previously configured BRAM or ROM, or some other noise induced event that may produce anomalous results. Efforts continue, therefore, to mitigate the effects of induced noise during functional vector testing.

SUMMARY

To overcome limitations in the prior art, and to overcome other limitations that will become apparent upon reading and understanding the present specification, various embodiments of the present invention disclose an apparatus and method to substantially reduce noise induced errors in the initialized state of a programmable logic device (PLD) subsequent to configuration.

In accordance with one embodiment of the invention, an integrated circuit (IC) test system comprises a configuration bitstream generator that is coupled to receive logic configuration information and is adapted to generate a configuration bitstream from the logic configuration information. The IC includes programmable logic and programmable interconnect. The configuration bitstream includes a first data set that defines a logic configuration for an IC and a second data set that defines a startup sequence for the IC. The IC test system further comprises a noise suppression block that is coupled to the configuration bitstream generator and is adapted to modify the configuration bitstream by removing the second data set from the configuration bitstream and is further adapted to provide the modified configuration bitstream to the configuration bitstream generator. The IC test system further comprises a data format module that is coupled to receive the modified configuration bitstream from the configuration bitstream generator and is adapted to provide the modified configuration bitstream to a configuration port and is further adapted to initiate an IC test sequence via an execution port.

In accordance with another embodiment of the invention, a method of eliminating noise during integrated circuit (IC) testing comprises generating a configuration bitstream, modifying the configuration bitstream by removing a startup sequence from the configuration bitstream in response to detecting a startup sequence within the configuration bitstream, downloading the modified configuration bitstream to an IC using a configuration port to configure the IC for operation in accordance with a logic function, and downloading a startup command to the IC using an execution port after the IC is configured to perform the logic function.

In accordance with another embodiment of the invention, a method of reducing noise induced errors during integrated circuit (IC) testing comprises deactivating a first set of input/output (I/O) pins associated with an IC, receiving a configuration bitstream using a second set of I/O pins associated with the IC during a configuration phase, where the configuration bitstream is devoid of a startup sequence. The method further comprises monitoring the second set of I/O pins for the receipt of a startup sequence and activating the first set of I/O pins associated with the IC in response to detecting the startup sequence.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention provides for the substantial reduction of noise induced errors produced within the integrated circuit (IC), such as a PLD, once configuration of the IC has taken place. This is done by removing the opportunity for the IC to receive noise during its noise vulnerable stage, i.e., the time period subsequent to configuration and prior to test execution. Next, a technique is employed to initiate the IC test after the configuration state of the IC has ended. In particular, the IC test is initiated during the functional vector state of the IC, so that any input/output (I/O) pins that would have ordinarily been used to initiate the IC test during the configuration state are instead made available for functional test pattern usage during the functional vector state of the IC.

A method and apparatus is also presented, whereby a standard 4-wire test access port (TAP) may be used both for in-system programming (ISP) and IEEE 1149.1 boundary scan testing. Thus, serial vector format (SVF) stimulus files may be used, not only to describe, program, and initiate the test algorithms required by the IC, but SVF configuration files may also be used to configure the IC as well. Other configuration techniques are presented, which may also be used in conjunction with the SVF test initiation to substantially reduce noise induced errors prior to IC testing.

Figure 1:
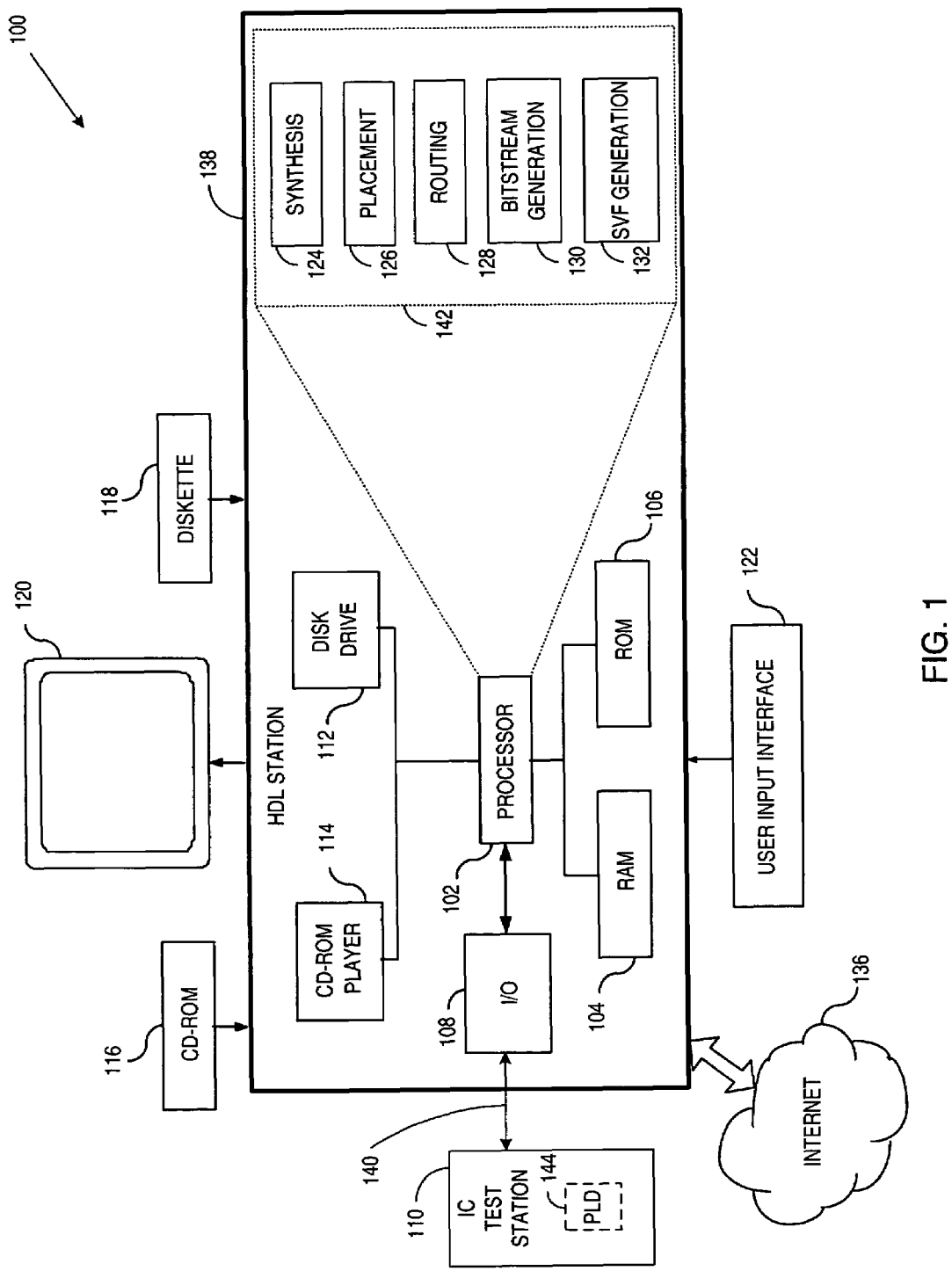
FIG. 1 illustrates an exemplary hardware description language (HDL) development station.

Turning to FIG. 1, a block diagram of a hardware design language (HDL) workstation is exemplified, whereby HDL station 138 generates configuration bitstream and test stimulus files for transmission via configuration/test execution bus 140 to IC test station 110 during the configuration and subsequent test phase of PLD 144. Verilog and VHDL represent two of the more popular HDL languages in use today, which may be used to define the structure of a PLD based design. In particular, HDL facilitates a description of the manner in which a design is decomposed into sub-blocks of logic resources and further allows a description of the manner in which each sub-block of the design is to be interconnected.

The exemplary computing arrangement that is suitable for performing HDL definition activities includes HDL station 138, which further includes a central processor (CPU) 102 coupled to random access memory (RAM) 104 and read-only memory (ROM) 106. The ROM 106 may also be implemented using other types of storage media to store programs, such as programmable ROM (PROM), electronically erasable PROM (EEPROM), etc. The processor 102 may communicate with other internal and external components through input/output (I/O) circuitry 108 to provide, for example, configuration bitstream and test execution commands to IC test station 110.

HDL station 138 may also include one or more data storage devices, including hard and floppy disk drives 112, CD-ROM drives 114, and other hardware capable of reading and/or storing information, such as DVD, etc. Software for facilitating the HDL implementation of a reconfigurable design may be stored and distributed on a CD-ROM 116, diskette 118 or other form of media capable of portably storing information. These storage media may be inserted into, and read by, devices such as the CD-ROM drive 114, the disk drive 112, etc.

The software for facilitating the HDL and SVF development may also be transmitted to HDL station 138 via data signals, such as being downloaded electronically via a network, such as Internet 136. HDL station 138 is coupled to a display 120, which may be any type of known display or presentation screen, such as LCD displays, plasma display, cathode ray tubes (CRT), etc. A user input interface 122 is provided, including one or more user interface mechanisms such as a mouse, keyboard, microphone, touch pad, touch screen, voice-recognition system, etc.

Processor 102 may be used to execute integrated software environment (ISE) 142 in order to aid the synthesis 124, placement 126, and routing 128 of the hardware definitions extracted from the HDL files. Once the design is synthesized, placed, and routed, a configuration bitstream is generated by bitstream generation block 130 and transmitted to PLD 144 of IC test station 110 via configuration/test execution bus 140. As discussed in more detail below, configuration/test execution bus 140 may represent one of many configuration interfaces, including both serial and parallel configuration interfaces.

Configuration/test execution bus 140 may also support the IEEE 1532 standard for in-system configuration (ISC), which is based on the IEEE 1149.1 standard. The IEEE 1149.1 test access port (TAP) and boundary scan architecture is commonly referred to as a Joint Test Action Group (JTAG) port. JTAG was established as a means to assure the individual integrity of individual components and their interconnection at the board level.

Once PLD 144 of IC test station 110 has been configured, SVF files may be generated by SVF generation block 132 and provided to IC test station 110 via configuration/test execution bus 140. The TAP and boundary scan architecture may also be used to download the SVF files to the PLD under test to initiate testing. As such, test initiation is not integrated with the configuration phase of the PLD. Rather, the PLD is held in a substantially protected state, whereby the initial condition of the PLD is held constant after the configuration phase and until the test initiation sequence has been commenced during execution of the functional vector phase.

Figure 2:
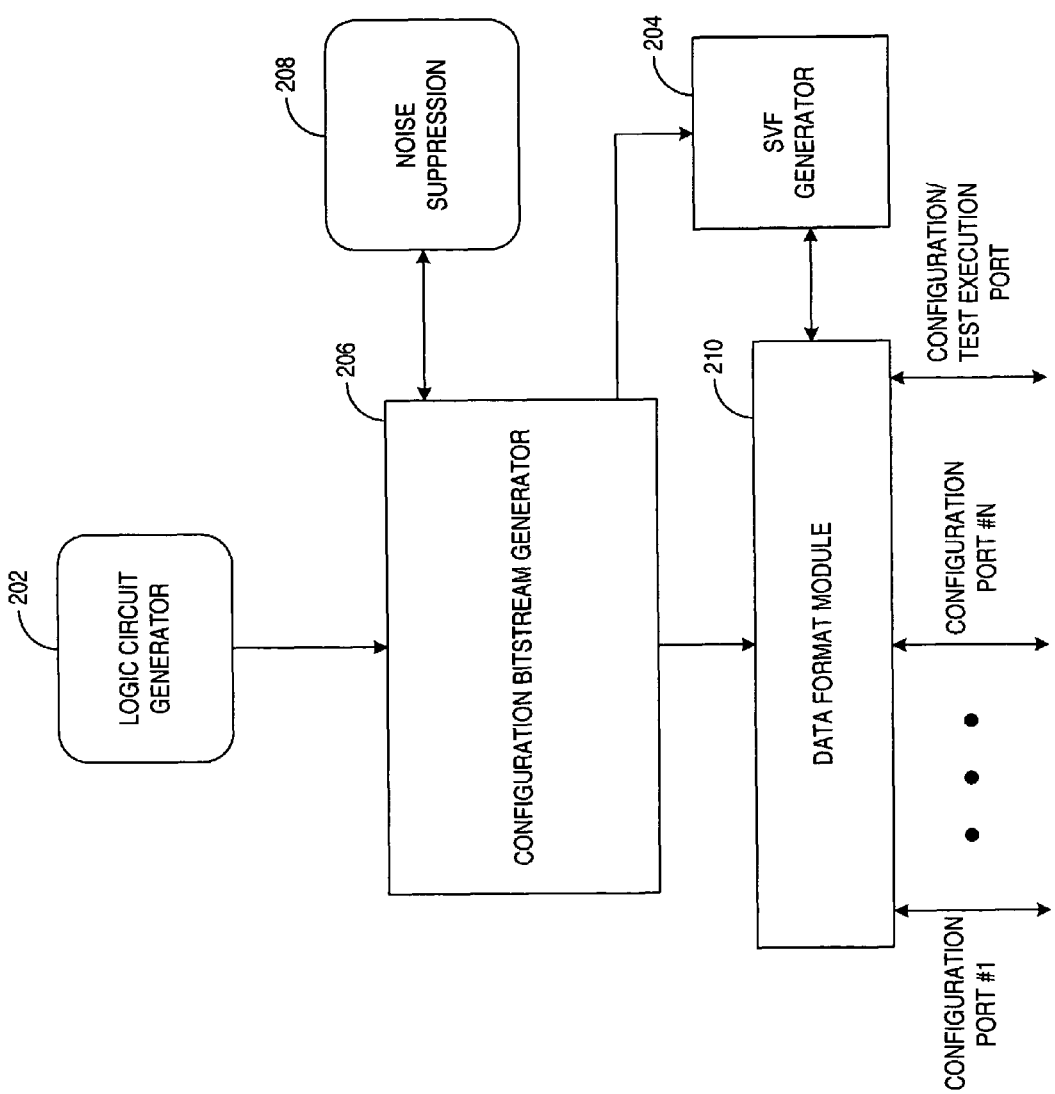
FIG. 2 illustrates an exemplary configuration bitstream and serial vector format (SVF) block diagram of the HDL development station of FIG. 1.

Turning to FIG. 2, an exemplary configuration bitstream and SVF generation block diagram of HDL development station 138 is illustrated. Logic circuit generator 202 may represent the synthesis 124, placement 126, and routing 128 blocks of ISE block 142, which provides a fully routed native circuit description (NCD) file to configuration bitstream generator 206. The NCD file contains all of the configuration information that is necessary to define the internal logic and interconnections of PLD 144.

Configuration bitstream generator 206 may then receive the NCD file from logic circuit generator 202 and combine it with other files, which provide device-specific information that may be associated with PLD 144 of IC test station 110. The NCD file and device-specific information is then combined to form a configuration bitstream, which when downloaded to PLD 144 during a configuration phase, is effective to configure PLD 144 to function in accordance with a particular logic function.

Prior to downloading the configuration bitstream to PLD 144, configuration bitstream generator block 206 may first transmit the configuration bitstream to noise suppression block 208. In one embodiment, for example, noise suppression block 208 may scan the configuration bitstream for any start-up, e.g., wake-up, sequence that may be contained therein. An exemplary wake-up sequence that may be contained within the configuration bitstream may include the assertion of a global write enable (GWE) signal, which allows RAM and flip-flops within PLD 144 to change state, followed by a deassertion of a global 3-state (GTS) signal, which activates all I/O associated with PLD 144.

If a wake-up sequence is detected, the wake-up sequence may be removed by noise suppression block 208. The modified configuration bitstream may then be provided to configuration bitstream generator block 206 from noise suppression block 208 for transmission to data format module 210. The configuration bitstream may then be downloaded to PLD 144 from data format module 210 and stored within configuration memory cells of PLD 144 to define a particular logic function to be performed by PLD 144.

In one embodiment, data format module 210 may support a serial configuration port, whereby either a slave serial or master serial configuration mode is utilized. In slave serial configuration mode, for example, one configuration bit is loaded into PLD 144 per clock cycle, whereby the clock signal (not shown) is generated by data format module 210. In master serial configuration mode, on the other hand, one configuration bit is loaded into PLD 144 per clock cycle, but the clock signal (not shown) is instead generated by PLD 144.

In an alternate embodiment, data format module 210 may support a parallel configuration mode, whereby either a slave parallel or a master parallel configuration mode is utilized. In slave parallel configuration mode, for example, an n-bit, bi-directional data bus is utilized to deliver configuration data to PLD 144 from data format module 210 in response to a clock signal (not shown) provided by data format module 210. In master parallel configuration mode, on the other hand, n-bit, bi-directional configuration data is delivered to PLD 144 from data format module 210 in response to a clock signal (not shown) provided by PLD 144. In either of master or slave parallel configuration modes, the configuration data may be read back by data format module 210 to verify that the memory cells within PLD 144 have been properly configured.

Once PLD 144 has been configured, configuration bitstream generator 206 passes control of the test sequence to SVF generator 204. At this instant, PLD 144 is held in a protected state, such that the configuration memory cells, flip-flops, RAM, and other volatile logic within PLD 144 are not allowed to toggle their respective logic values. Furthermore, any I/O associated with PLD 144, other than the JTAG port, is deactivated during the protected state, so that PLD 144 remains non-responsive to external stimulus.

In an alternate embodiment, data format module 210 and SVF generator 204 may support the IEEE 1532 standard for in-system configuration (ISC) and testing. SVF configuration files, for example, may first be used to configure PLD 144 in accordance with an exemplary logic function. SVF execution files may then be used to exercise the exemplary logic function using a predetermined stimulus. Responses to the predetermined stimulus may then be compared to the expected responses for test verification.

In particular, configuration bitstream generator 206 may first provide the configuration bit stream to SVF generator 204 for conversion to an SVF configuration file. The SVF configuration file may contain, for example, specific TAP control information, along with the configuration bitstream provided by configuration bitstream generator 206, that is required to properly configure PLD 144. The SVF configuration file may then be provided to data format module 210 by SVF generator 204 for delivery to PLD 144 via the configuration/test execution port, e.g., the TAP interface, for PLD 144 configuration.

Once PLD 144 is configured, SVF generator 204 may then initiate the test sequence by generating an SVF test execution file to data format module 210 for subsequent download to IC test station 110 via the TAP interface. The SVF test execution file may contain, for example, specific TAP control information, so that PLD 144 may be exercised in accordance with stimulus/response vectors contained within the SVF test execution file.

Figure 3:
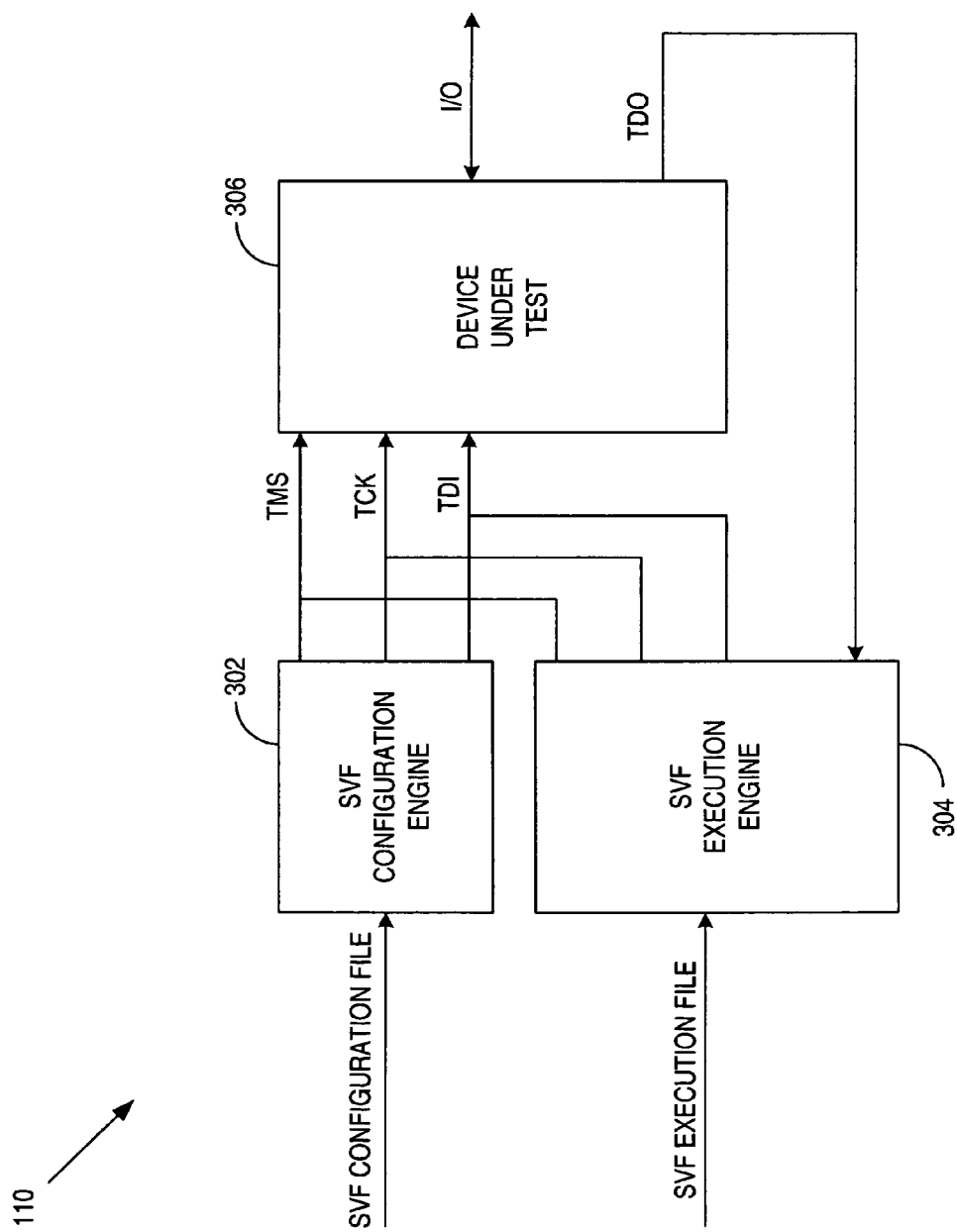
FIG. 3 illustrates an exemplary integrated circuit (IC) test platform for reception of test vector and configuration files from the SVF generator of FIG. 2.

Turning to FIG. 3, an exemplary block diagram of IC test station 110 is illustrated, whereby SVF configuration engine 302 is configured to receive an SVF configuration file from data format module 210. In response, SVF configuration engine 302 converts the SVF configuration file into a configuration data stream to cycle device under test (DUT) 306 through the configuration sequence via TAP controller pins TMS, TCK, and TDI. The test mode select (TMS) pin determines the sequence of states that are to be executed by DUT 306, the test data in (TDI) pin is the serial input to all JTAG instruction and data registers of DUT 306, and the test clock (TCK) pin is the JTAG test clock.

Similarly, SVF execution engine 304 is configured to receive an SVF execution file from data format module 210. SVF commands, such as SDR, SIR, and RUNTEST, may be contained within the SVF execution file and converted by SVF file execution engine 304 into an execution data stream to coordinate testing of DUT 306. The SDR/SIR commands, for example, may be used to specify a scan pattern to be applied to the target scan registers within DUT 306. In particular, the scan data register (SDR) command, for example, may be used to specify a data pattern to be scanned into the data register of DUT 306. The scan instruction register (SIR) command, on the other hand, may be used to specify a data pattern to be scanned into the instruction register of DUT 306. The RUNTEST command may be used to hold the IEEE 1149.1 bus in the RUN-Test/Idle state for a specific number of TCK periods.

The SVF execution file may also contain instructions as to how to interpret the test results received from DUT 306. In particular, the SVF execution file may contain the predicted test data out (TDO) vector that should be received from DUT 306 in response to a test data in (TDI) vector that was received by DUT 306 during a particular test sequence. The SVF execution file may also specify actions to be taken should the TDO vector received from DUT 306 not match the expected TDO vector as specified by the SVF execution file.

Figure 4:
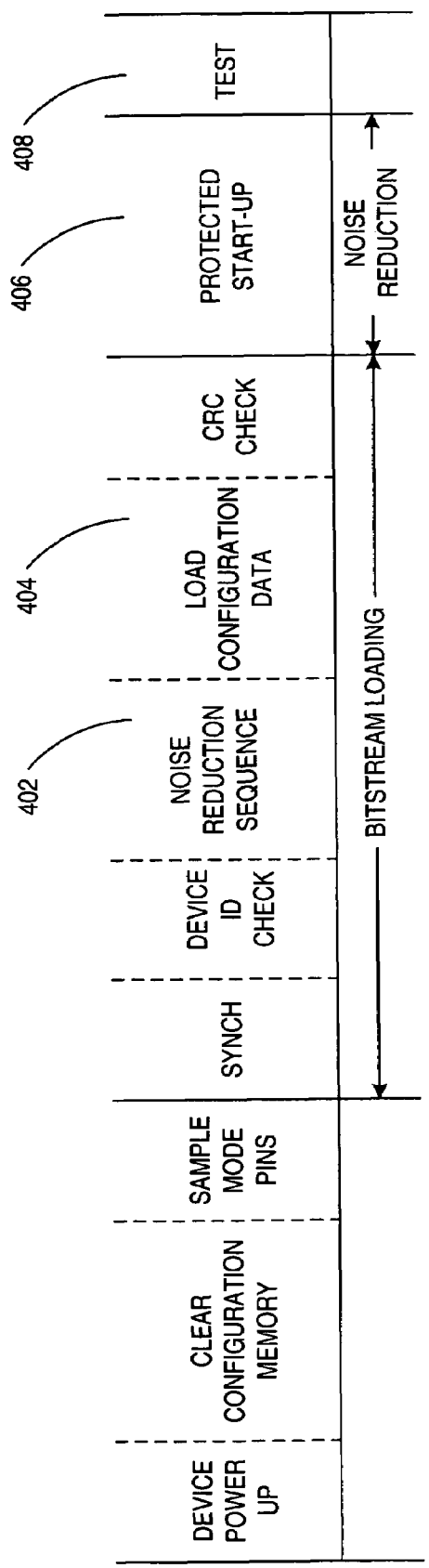
FIG. 4 illustrates an exemplary configuration and test initiation sequence received by the IC of FIG. 3.

Turning to FIG. 4, an exemplary configuration/test execution sequence is illustrated, which describes the configuration/test process for PLD 144 that is coordinated by IC test station 110. To begin, the power supplies associated with PLD 144 are energized in accordance with specific configuration power-up timing parameters. Next, all configuration memory cells are cleared and the configuration mode pins of PLD 144 are sampled to determine the configuration mode, e.g., serial, parallel, or JTAG, that is to be used to configure the configurable logic portion of PLD 144. Next, a predetermined synchronization word is transmitted to the configuration logic portion of PLD 144, which alerts PLD 144 as to the upcoming configuration data and aligns the configuration data with the internal configuration logic of PLD 144.

Once PLD 144 is synchronized, a device identification check is performed to ensure that the configuration bitstream is formatted properly for PLD 144. Prior to configuration, noise reduction sequence 402 is then executed by noise suppression block 208 of FIG. 2, in order to determine whether a wake-up sequence is included with the configuration bitstream. If so, noise suppression block 208 strips the wake-up sequence from the configuration bitstream and returns the modified configuration bitstream to configuration bitstream generator 206. Noise reduction sequence 402 also disables all I/O of PLD 144 that is not involved with the configuration phase of PLD 144.

Next, load configuration data sequence 404 is executed during a configuration phase of PLD 144, so that PLD 144 may be configured to perform an exemplary logic function that is described by the modified configuration bitstream. In one embodiment, JTAG configuration of PLD 144 may be implemented as described above in relation to FIG. 3. JTAG configuration, for example, may be initiated by transmitting the CFG_IN instruction, represented for example by the binary sequence "111000101", via the TDI pin of PLD 144. Alternatively, serial or parallel configuration may be performed as discussed above in relation to FIG. 2.

A cyclic redundancy check (CRC) value may be included within the modified configuration bitstream and compared by PLD 144 to a CRC value calculated by PLD 144 during load configuration data sequence 404. Should the two CRC values match, then proper configuration of PLD 144 is verified. Otherwise, the load configuration data sequence 404 may be repeated to verify proper configuration of PLD 144 should the two CRC values not match.

Protected start-up sequence 406 is the combined result of noise reduction sequence 402 and the operation of SVF execution engine 304. If a wake-up sequence exists within the configuration bitstream, for example, then the wake-up sequence is removed from the configuration bitstream so that PLD 144 may remain isolated from further activity at the I/O pins of PLD 144 once it has been configured. Further, the start-up sequence is reserved for execution by SVF execution engine 304. In particular, only when the test has been initiated via JTAG instruction, e.g., JSTART, will the remaining I/O be activated to commence the test. As such, the configured and initialized state of PLD 144 may be protected through the substantial reduction of noise contamination until the actual test vectors are to be executed as in test sequence 408.

It should be noted, that protected startup sequence 406 places PLD 144 into a protected state, whereby all I/O, except for the JTAG port, is deactivated. Only when a start-up sequence, such as the JSTART instruction, has been received by the TDI pin of the TAP interface, will the I/O pins associated with PLD 144 be available to receive stimulus. In one embodiment, the startup sequence of PLD 144 may be initiated by transmitting the binary sequence "111001100" via the TDI pin of PLD 144.

Figure 5:
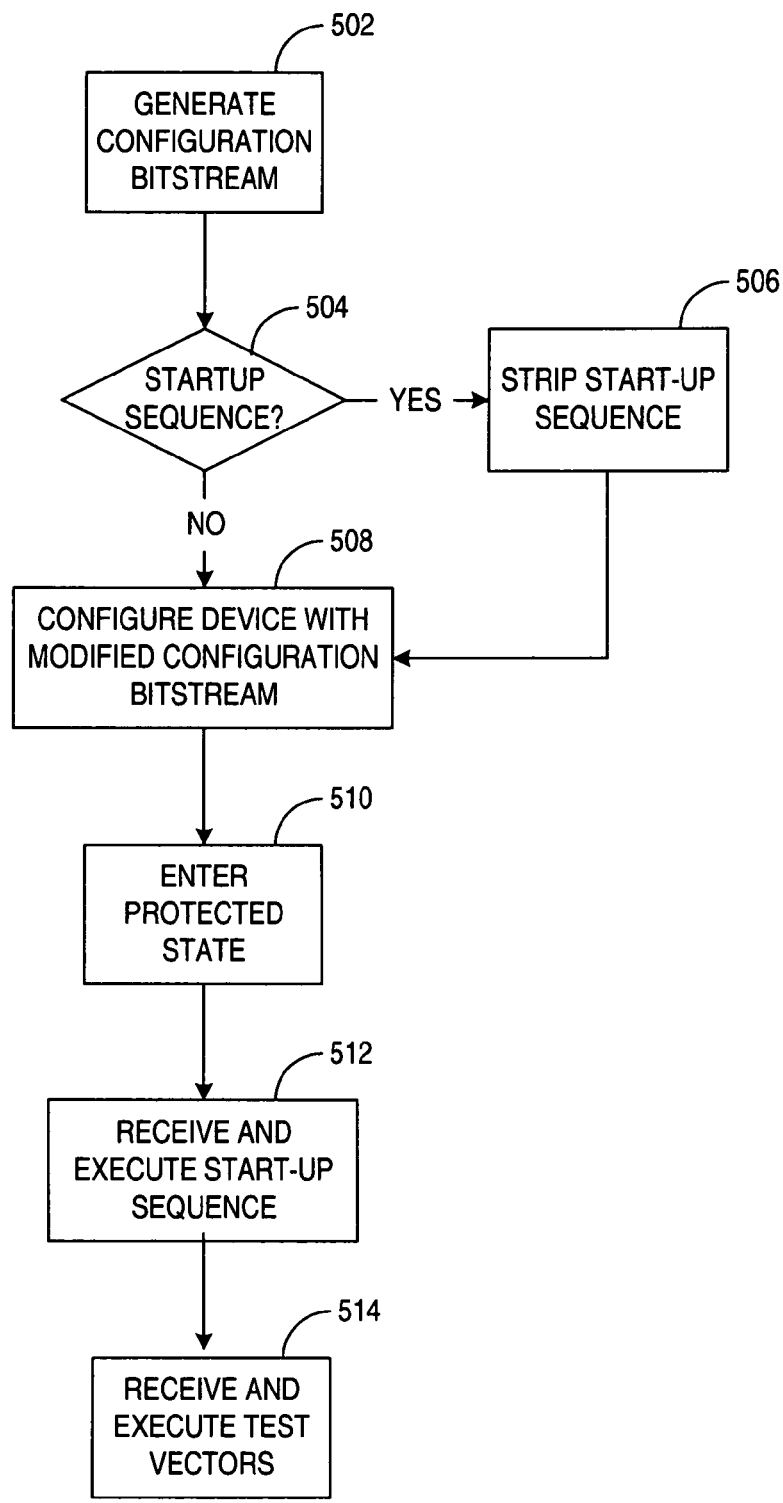
FIG. 5 illustrates an exemplary flow diagram of a method to substantially eliminate noise induced errors prior to testing of the IC of FIG. 3.

Turning to FIG. 5, a method of protecting a DUT from noise induced error is exemplified. In step 502, a configuration bitstream is generated, which provides a definition of a logic function to be performed by the DUT, such as PLD 144 of FIG. 1. The configuration bitstream is then scanned for the existence of a wake-up sequence as in step 504. If a wake-up sequence is detected within the configuration bitstream, then the wake-up sequence is deemed to be premature and is therefore stripped from the configuration bitstream as in step 506. The DUT may then be configured in step 508 using any one of a number of configuration embodiments including the serial, parallel or JTAG configuration embodiments as discussed above in relation to FIGS. 2 and 3.

Once properly configured, the DUT enters a protected state as defined in step 510, in which all I/O associated with the DUT is deactivated, except for the JTAG port. Only when a startup sequence, e.g., the JSTART instruction, is received via the TAP interface, will the DUT be available to receive test vector stimulus at its I/O pins. Once a proper startup sequence is executed via the TAP interface (step 512), the test vectors as defined, for example, by an SVF execution file may then be executed as in step 514.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of reducing noise during integrated circuit (IC) testing, comprising:
   generating a configuration bitstream;
   modifying the configuration bitstream by removing a startup sequence from the configuration bitstream in response to detecting the startup sequence within the configuration bitstream;
   downloading the modified configuration bitstream to an IC using a configuration port to configure the IC for operation in accordance with a logic function; and
   downloading a startup command to the IC using an execution port after the IC is configured to perform the logic function.

2. The method of claim 1, wherein downloading the modified configuration bitstream includes using either a serial configuration port or a parallel configuration port.

3. The method of claim 1, further comprising downloading the start-up sequence to the IC after downloading the startup command.

4. The method of claim 1, wherein downloading the modified configuration bitstream includes using a Joint Test Action Group (JTAG) configuration port.

5. The method of claim 4, wherein downloading the startup command includes using the JTAG execution port.

* * * * *